US005789846A

United States Patent [19]

Brown

[11] Patent Number: 5,789,846

[45] Date of Patent: Aug. 4, 1998

[54] CAPACITIVELY COUPLED GROUND ELECTRODE FOR PIEZO-ELECTRIC FILM

[75] Inventor: Richard Hunter Brown, Dreieich-Offenthal, Germany

[73] Assignee: The Whitaker Corporation, Wilmington, Del.

[21] Appl. No.: 761,766

[22] Filed: Dec. 5, 1996

[30] Foreign Application Priority Data

Dec. 13, 1995 [GB] United Kingdom .................. 9525432

[51] Int. Cl.[6] ...................... H01L 41/08

[52] U.S. Cl. ...................... 310/366; 310/334; 310/365

[58] Field of Search ...................... 310/334–337, 310/365, 366, 368, 369

[56] References Cited

U.S. PATENT DOCUMENTS

| | | | |
|---|---|---|---|
| 3,307,052 | 2/1967 | Neilson et al. | 310/365 X |
| 4,217,684 | 8/1980 | Brisken et al. | 310/334 X |
| 4,365,515 | 12/1982 | Abts | 310/334 X |
| 4,425,525 | 1/1984 | Smith et al. | 310/336 |
| 4,460,841 | 7/1984 | Smith et al. | 310/334 |
| 4,469,976 | 9/1984 | Scott | 310/334 |
| 4,628,285 | 12/1986 | Nakatani et al. | 310/366 X |
| 5,493,541 | 2/1996 | Snyder | 310/365 X |

*Primary Examiner*—Mark O. Budd
*Attorney, Agent, or Firm*—Driscoll Nina

[57] ABSTRACT

A piezo electric film has a signal electrode on one side of the film and a primary ground electrode on the other side of the film. The signal and ground electrodes are for connection to external conductors that process the electrical signals of the piezo film. In order to facilitate connection of the ground electrode to an external ground conductor, a secondary ground electrode is provided on the same side of the film as the signal electrode. The secondary ground electrode is capacitively coupled to the primary ground electrode. This arrangement enables connection of signal and ground conductors to the electrodes from one side only, which, for example, enables the piezo film to be mounted on a printed circuit board directly in contact with conductive circuit traces. An industrial application may be for piezo electric transducers, such as used in liquid level sensors.

10 Claims, 3 Drawing Sheets

CAPACITIVELY COUPLED GROUND ELECTRODE FOR PIEZO-ELECTRIC FILM

BACKGROUND OF THE INVENTION

1. Field of the Invention

This invention relates to a means for connecting a grounding electrode of a film, without direct connection thereto.

2. Description of the Prior Art

Piezo electric transducers for receiving or transmitting signals, for example ultrasonic signals, may be made of a film of piezo-electric material, such as specially prepared PVDF (Polyvinilidene Fluoride), which has metallized surfaces on either side. One of the metallized surfaces is a signal electrode, and the other a grounding electrode. Generation of a voltage difference between the signal and ground electrodes leads to the generation of mechanical forces in piezo electric film, or vice versa generation of mechanical forces on the film causes a potential difference between the signal and ground electrodes. Piezo electric film can thus act as an accelerometer or device that generates vibration or other movement. Particular designs can therefore act as a transmitter or receiver of ultrasonic waves, for example.

The signal and ground electrodes need to be interconnected to signal and ground conductors for interconnection to electronics circuitry that processes the signals. In certain circumstances it is not practical to feed conductors to both sides of a film as this may means, for example, punching a hole through the film and feeding a conductor therethrough, or going around the edge of the film with a conductor which somehow needs to be affixed thereto. An example of an application where attaching the ground and signal electrodes on either side of a film is a problem, is when such film is mounted directly on a printed circuit board. In such a design, the signal electrode can be interconnected to conductive circuit pads on the surface of the printed circuit board by directly laying thereagainst whereas the other side of the film comprising the grounding electrode can be connected to the printed circuit board by touching a conductive rivet that engages the outer surface of the film and passes through the printed circuit board to engage circuit traces thereon. The latter may significantly increase manufacturing costs, or may not prove to be particularly reliable in certain circumstances of vibration or thermal solicitation that may impair the interconnection between the rivet and the ground electrode, and furthermore reduces the effective surface of the active piezo film. The provision of a hole may also require a sealing thereof, adding to the complications.

Provision of a piezo electric transducer where a film is mounted directly on a printed circuit board, is a relatively advantageous design as electronics for processing the piezo electric signals can be directly provided on the printed circuit board and interconnected to the piezo film in a compact and cost-effective manner.

It would be desirable to have a simpler but nevertheless reliable means of connecting electrodes on either side of piezo film in a cost-effective and compact manner.

SUMMARY OF THE INVENTION

It is an object of this invention to provide a means for interconnecting electrodes on either side of a thin film in a simple and cost-effective manner.

It is another object of this invention to provide a simple, cost-effective but nevertheless reliable means of interconnecting signal and ground electrodes of a piezo electric film to external circuitry.

It would be advantageous to provide a means for interconnecting signal and ground electrodes of a piezo electric film mounted on a printed circuit board in a very simple manner.

Objects of this invention have been achieved by providing a film having electrodes on either side thereof, one side having a signal electrode and the other side having a primary ground electrode, the signal electrode being directly interconnectable to an external conductor, and having a smaller surface area in comparison with the primary ground electrode, the film further comprising a secondary ground electrode on the same side of the film as the signal electrode and having a surface area adapted for capacitive coupling to the primary ground electrode, such that the primary ground electrode behaves substantially as a ground electrode connected directly via a conductor to ground, within the normal range of functioning of the device.

Capacitive coupling of the primary ground electrode by means of the secondary ground electrode thus enables both the signal and secondary ground electrodes to be contacted to conductors on a same side. This enables for example, mounting on a printed circuit board and interconnection of conductive pads of the PCB to the ground and signal electrodes.

Further advantageous features of this invention will be apparent from the following description, drawings and claims.

DETAILED DESCRIPTION OF THE PREFERRED EMBODIMENT

Figure 1:
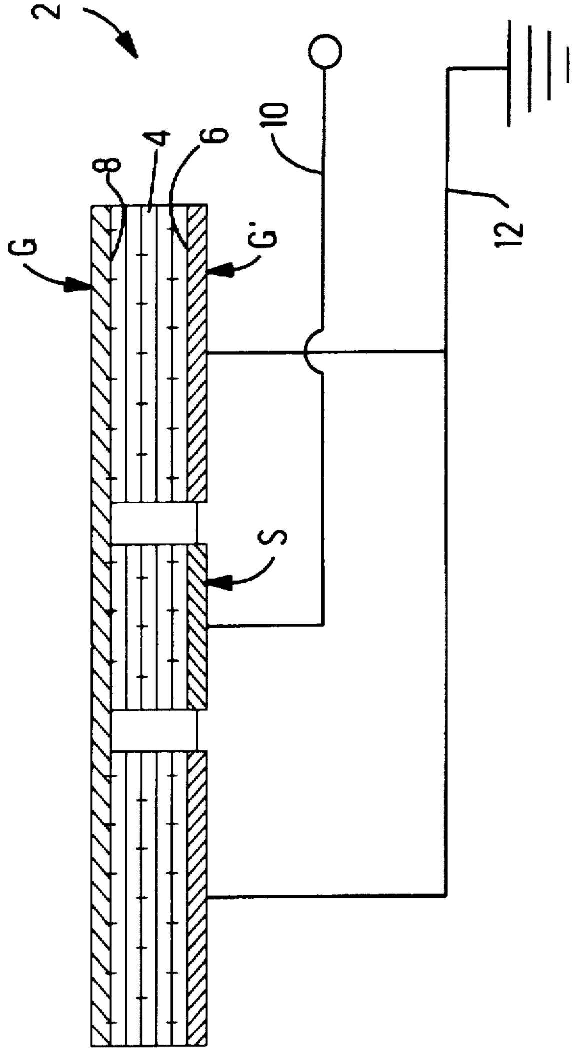
FIG. 1 is a schematic cross-sectional view of a film having signal and secondary ground electrodes according to this invention.

Referring to FIG. 1, a piezo electric film 2 comprises a piezo electric layer, for example PVDF (Polyvinilidene Fluoride) having piezo electric characteristics, a signal electrode (S) on one side 6 of the film 4, and a primary ground electrode (G) on the other side 8 of the film 4. The signal electrode (S) is connected via an external conductor 10 to electronic circuitry. The signal electrode occupies a relatively small surface area of the side 6 in comparison to the surface area of the primary ground electrode (G) on the side 8. On the signal electrode side 6, is a secondary ground electrode (G') that occupies a larger surface area than the signal electrode (S) and is positioned opposite a large portion of the ground electrode (G) on the other side. The secondary electrode (G') is connected via an external conductor 12 to ground.

Figure 2:
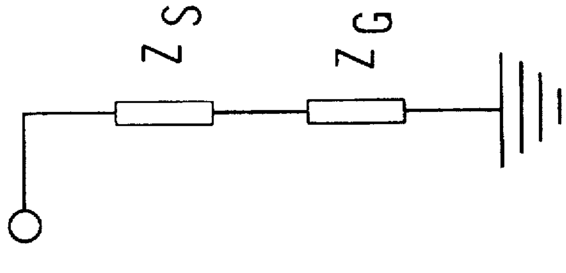
FIG. 2 is a schematic representation of the electrical path between the signal electrode and ground of the embodiment of FIG. 1.

The signal electrode (S) is capacitively coupled to the ground electrode (G) with an impedance ($Z_S$), and whereby the primary ground electrode (G) is capacitively coupled to the secondary ground electrode (G') with an impedance ($Z_G$). As represented in FIG. 2, these impedances $Z_S$ and $Z_G$ act in series between the signal electrode and ground. In a conventional situation, where ground electrode G is directly coupled to a conductor, $Z_G$ is equal to 0 in the representation on FIG. 2.

In order for the design of FIG. 1 to approximate direct connection to ground $Z_G$ should be small in comparison to the impedance $Z_S$. Just how small will depend on the required signal to noise ratio and sensitivity of the Piezo electric device. The capacitance values of the signal S to primary ground G ($C_S$), and the capacitance value of the primary ground G to the secondary ground G' ($C_G$), and the value of the impedance ($Z_G$) between the primary ground G and secondary ground G' can be expressed mathematically as:

$$C_S = \epsilon A_S/t$$

$$C_G = \epsilon A_G/t$$

$$Z_G = 1/2\pi f C_G$$

where:

Σ is the dielectric constant of the film $A_S$ is the surface area of the signal electrode $A_G$ is the surface of the secondary ground electrode $Z_S$ is the impedance between the signal to primary ground electrode $Z_G$ is the impedance between the primary ground and secondary ground electrode.

As can be seen from the above formulas, in order to reduce the size of the impedance $Z_G$ one can increase the size of the capacitance $C_G$ between the ground electrodes, which in turn means increasing the surface area of the ground electrodes (in relation to the surface area of the signal electrodes). The impedance $Z_G$ however also depends on the frequency of excitation of the electrical impulses. At high frequency excitation, the capacitive coupling of the primary to secondary electrodes is improved.

Figure 3:
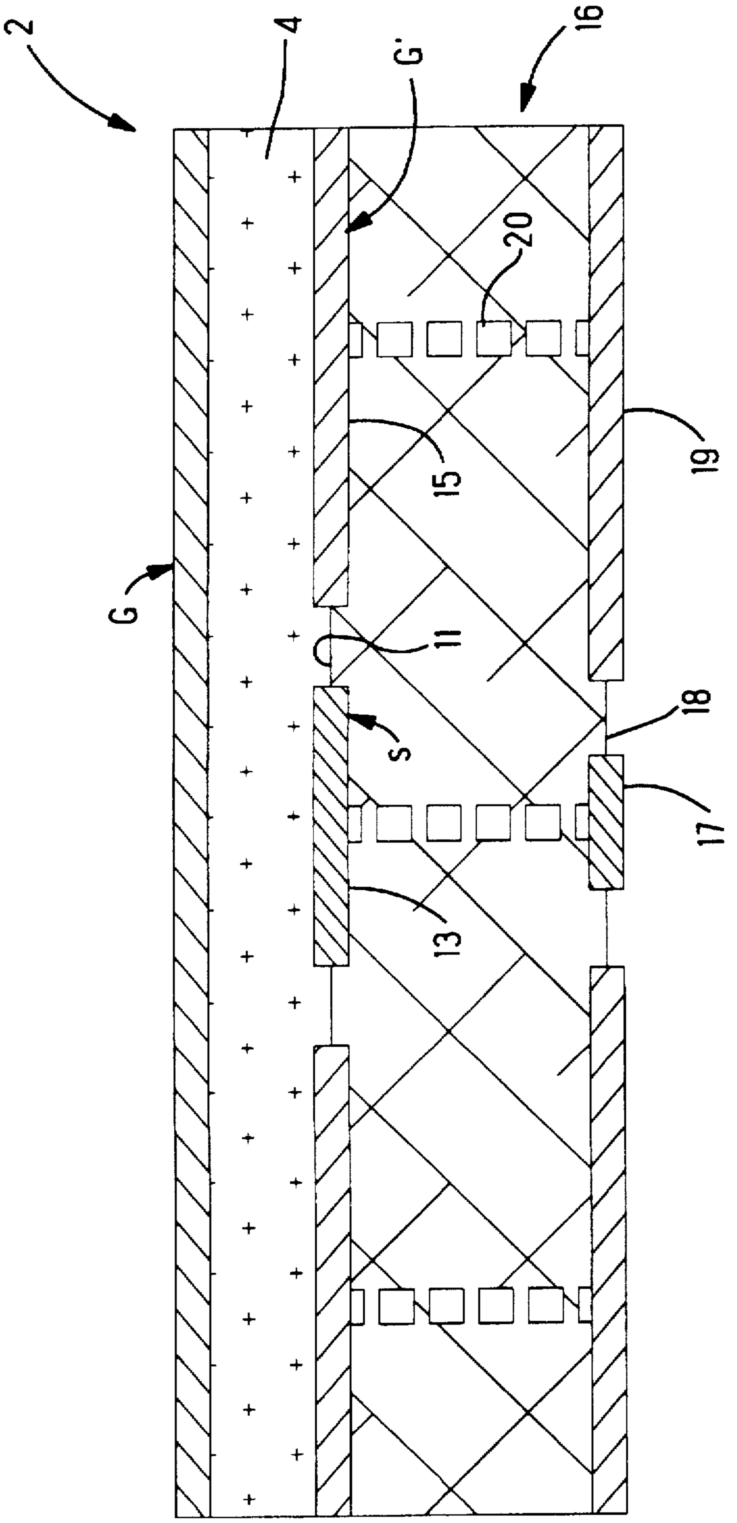
FIG. 3 is a schematic cross-sectional view of a film mounted on a printed circuit.

Referring to FIG. 3, the piezo film 2 is mounted on one side 11 of a printed circuit board 16 having conductive pads 13,15 against which the signal electrode and secondary ground electrodes are mounted for electrical connection thereto. The printed circuit board conductive pads 13,15 can be interconnected via circuit traces 17,19,20 thereon to electronic circuitry on the board for processing of the electrical signals. The pads on the printed circuit board 16 may also be interconnected to circuit traces on the other side 18 of the PCB via, for example, plated through-holes 20 such that one side of the printed circuit board 17 comprises the film 2 and the other side the electronic circuitry and components for a compact arrangement.

Figure 4A:
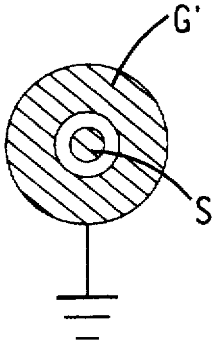
**FIGS. 4*a*, 4*b* and 4*c*** are various patterns of signal and secondary ground electrodes according to this invention.
Figure 4B:
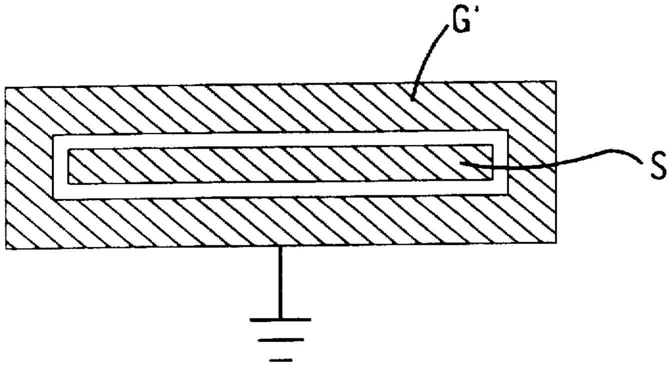
Figure 4C:
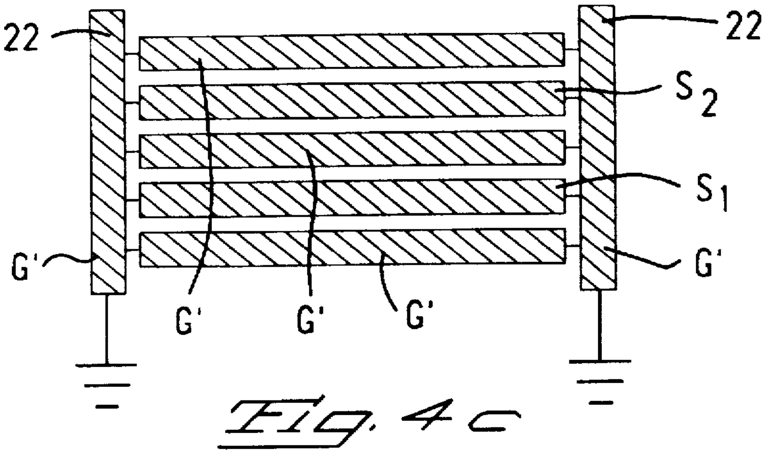

As illustrated in the FIGS. 4*a*,*b*,*c*, various arrangements of the signal and secondary ground electrodes S' and G' respectively can be provided depending on the geometry of the transducer or device, and the required proportion of ground electrode G' with respect to the signal electrode as was mentioned above. In FIG. 4*c*, an array of signal electrodes S1,S2 etc. can be arranged between secondary ground electrodes G' which are connected to secondary ground electrodes 22 flanking either end of the signal electrodes. Signal electrodes S1 and S2 may either be electrically connected to each other or separate, the electrical interconnection being achieved via the remote side 18 of a printed circuit board, for example.

It would of course also be possible to provide the secondary ground electrode G' not directly on the film 2, but on the support (e.g. the PCB 16) or which the film is mounted. This is also true for the signal electrode. In this way, only one side of the film is metallized, and the signal and primary ground electrode pattern could be made on the support (e.g. a PCB 16).

Advantageously therefore, a simple and reliable means of external connection to both signal and ground electrodes of a film is provided.

I claim:

1. A device comprising Piezo-electric film and electrodes on either side thereof, one side having a signal electrode and the other side having a primary ground electrode, the signal electrode being directly interconnectable to an external conductor and having a smaller surface area in comparison with the primary ground electrode, the device further comprising a secondary ground electrode on the same side of the film as the signal electrode and having a surface area adapted for capacitive coupling to the primary ground electrode, wherein the primary around electrode has no electrical connection to ground via a conductor, and the secondary around electrode has an electrical connection to ground via a conductor, whereby the primary ground electrode substantially simulates a ground electrode connected via a conductor directly to ground by the capacitive coupling to the secondary electrode, within the normal range of functioning of the device.

2. The device according to claim 1 wherein the device further comprises a printed circuit board (PCB) on which the piezo-electric film is mounted.

3. The device according to claim 2 wherein the signal and secondary ground electrodes are mounted against the PCB and in contact with signal and ground contact pads thereof respectively.

4. The device according to claim 1 wherein the signal electrode has a surface area smaller than the secondary ground electrode.

5. The device according to claim 1 wherein the signal and ground electrodes are provided directly on the piezo-electric film.

6. The device according to claim 1 wherein the signal electrode is surrounded by the secondary ground electrode.

7. The device according to claim 6 wherein the signal electrode is circular in shape, and the secondary ground electrode is in the shape of a ring concentrically surrounding the signal electrode.

8. The device according to claim 6 wherein the signal electrode is rectangular in shape.

9. The device according to any of claims 1–5 wherein a plurality of said signal electrode are positioned adjacent secondary ground electrodes in a juxtaposed relationship.

10. The device according to any of claims 2–4 wherein the signal and secondary ground electrodes are provided directly on the PCB.

* * * * *